United States Patent
Togashi

(10) Patent No.: US 11,469,158 B2
(45) Date of Patent: Oct. 11, 2022

(54) CONSTRUCTION OF INTEGRATED CIRCUITRY AND A METHOD OF FORMING AN ELEVATIONALLY-ELONGATED CONDUCTIVE VIA TO A DIFFUSION REGION IN SEMICONDUCTIVE MATERIAL

(71) Applicant: Micron Technology, Inc., Boise, ID (US)

(72) Inventor: Yuko Togashi, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 120 days.

(21) Appl. No.: 17/060,273

(22) Filed: Oct. 1, 2020

(65) Prior Publication Data

US 2021/0028091 A1  Jan. 28, 2021

Related U.S. Application Data

(62) Division of application No. 16/169,665, filed on Oct. 24, 2018, now Pat. No. 10,847,446.

(51) Int. Cl.
*H01L 21/8234* (2006.01)
*H01L 29/78* (2006.01)
(Continued)

(52) U.S. Cl.
CPC .......... *H01L 23/485* (2013.01); *H01L 21/743* (2013.01); *H01L 21/823425* (2013.01);
(Continued)

(58) Field of Classification Search
CPC .............. H01L 23/485; H01L 21/743; H01L 21/823425; H01L 21/823475; H01L 27/10852; H01L 29/0653
See application file for complete search history.

(56) References Cited

U.S. PATENT DOCUMENTS 5,293,512 A   3/1994  Nishicoori et al.
6,004,842 A  12/1999  Ikemasu et al.
(Continued)

FOREIGN PATENT DOCUMENTS

JP   06-053501   2/1994
JP   11-121710   4/1999
JP   2011-044625   3/2011

*Primary Examiner* — Dale E Page
*Assistant Examiner* — Wilner Jean Baptiste
(74) *Attorney, Agent, or Firm* — Wells St. John P.S.

(57) ABSTRACT

A construction of integrated circuitry comprises a trench isolation region in semiconductive material. The trench isolation region comprises laterally-opposing laterally-outermost first regions which comprise a first material and a second region laterally-inward of the first regions. The second region comprises a second material of different composition from that of the first material. A diffusion region is in the uppermost portion of the semiconductive material directly against a sidewall of one of the first regions. Insulator material is above the trench isolation region and the diffusion region. An elevationally-elongated conductive via is in the insulator material and extends to the diffusion region and the trench isolation region. The conductive via laterally overlaps the diffusion region and the one first region. The conductive via is directly against a top surface of the diffusion region, is directly against an upper portion of a sidewall of the diffusion region, and is directly against a laterally-outer sidewall of the second material of the second region of the trench isolation material. Other embodiments, including method, are disclosed.

19 Claims, 16 Drawing Sheets

(51) Int. Cl.
    *H01L 23/485*     (2006.01)
    *H01L 29/06*     (2006.01)
    *H01L 29/417*     (2006.01)
    *H01L 29/66*     (2006.01)
    *H01L 27/108*     (2006.01)
    *H01L 21/74*     (2006.01)

(52) U.S. Cl.
    CPC ............... *H01L 21/823475* (2013.01); *H01L 27/10852* (2013.01); *H01L 29/0653* (2013.01); *H01L 29/41766* (2013.01); *H01L 29/66636* (2013.01); *H01L 29/7834* (2013.01)

(56) References Cited

U.S. PATENT DOCUMENTS

| | | | |
|---|---|---|---|
| 6,897,542 B2 * | 5/2005 | Dennison | H01L 21/76802 257/209 |
| 2005/0250315 A1 * | 11/2005 | Tran | A61P 31/04 257/E21.579 |
| 2007/0040200 A1 | 2/2007 | Tran et al. | |
| 2016/0101801 A1 | 4/2016 | Zhu | |

* cited by examiner

CONSTRUCTION OF INTEGRATED CIRCUITRY AND A METHOD OF FORMING AN ELEVATIONALLY-ELONGATED CONDUCTIVE VIA TO A DIFFUSION REGION IN SEMICONDUCTIVE MATERIAL

RELATED PATENT DATA

This patent resulted from a divisional application of U.S. patent application Ser. No. 16/169,665 filed Oct. 24, 2018 entitled "A Construction Of Integrated Circuitry And A Method Of Forming An Elevationally-Elongated Conductive Via To A Diffusion Region In Semiconductive Material", naming Yuko Togashi as inventor, the disclosure of which is incorporated by reference.

TECHNICAL FIELD

Embodiments disclosed herein pertain to constructions of integrated circuitry and to methods of forming an elevationally-elongated conductive via to a diffusion region in semiconductive material.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry. Regardless, a conductive via is an elevationally-extending (e.g., vertical) conductor that is used to electrically connect upper and lower capacitors, transistors, and other integrated circuitry components together. For example, a conductive via may directly electrically couple to a diffusion region (e.g., a source/drain region of transistor) in semiconductive material and extend upwardly therefrom.

DETAILED DESCRIPTION OF EXAMPLE EMBODIMENTS

Embodiments of the invention encompass constructions of integrated circuitry and methods of forming an elevationally-elongated conductive via to a diffusion region in semiconductive material. Example embodiments of a method of forming an elevationally-elongated conductive via to a diffusion region in semiconductive material are described initially with reference to FIGS. 1-15.

Figure 1:
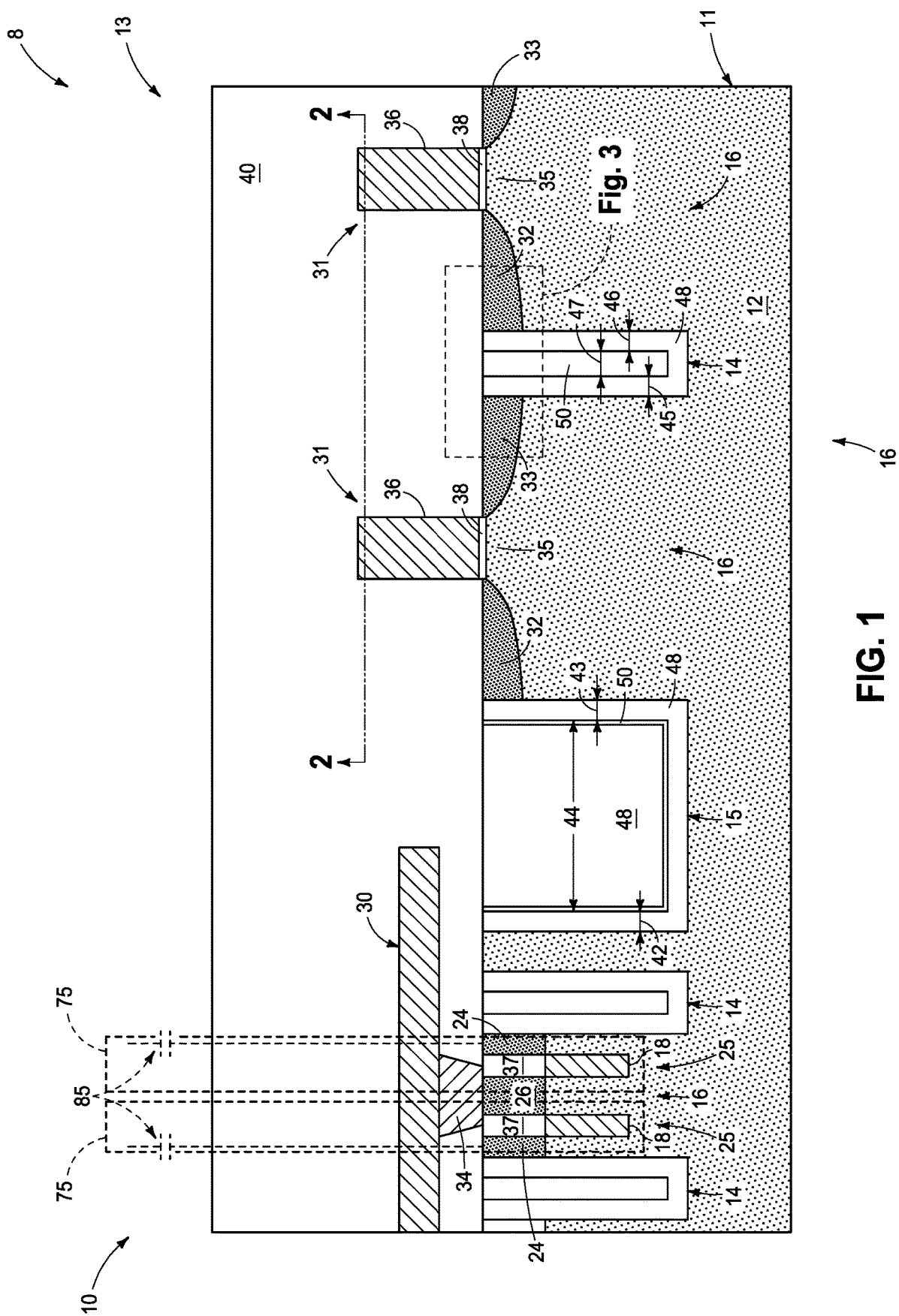
FIG. 1 is a diagrammatic cross-sectional view of a portion of a construction in process in accordance with some embodiments of the invention.
Figure 2:
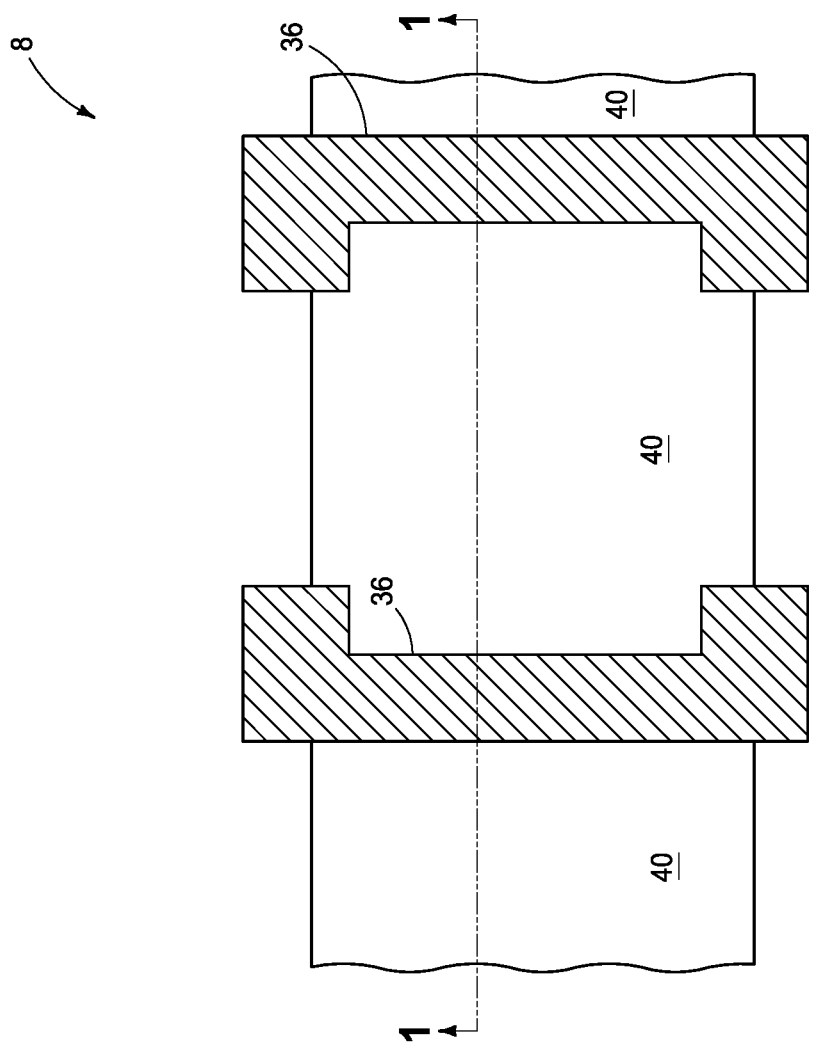
FIG. 2 is a view taken through line 2-2 in FIG. 1.
Figure 3:
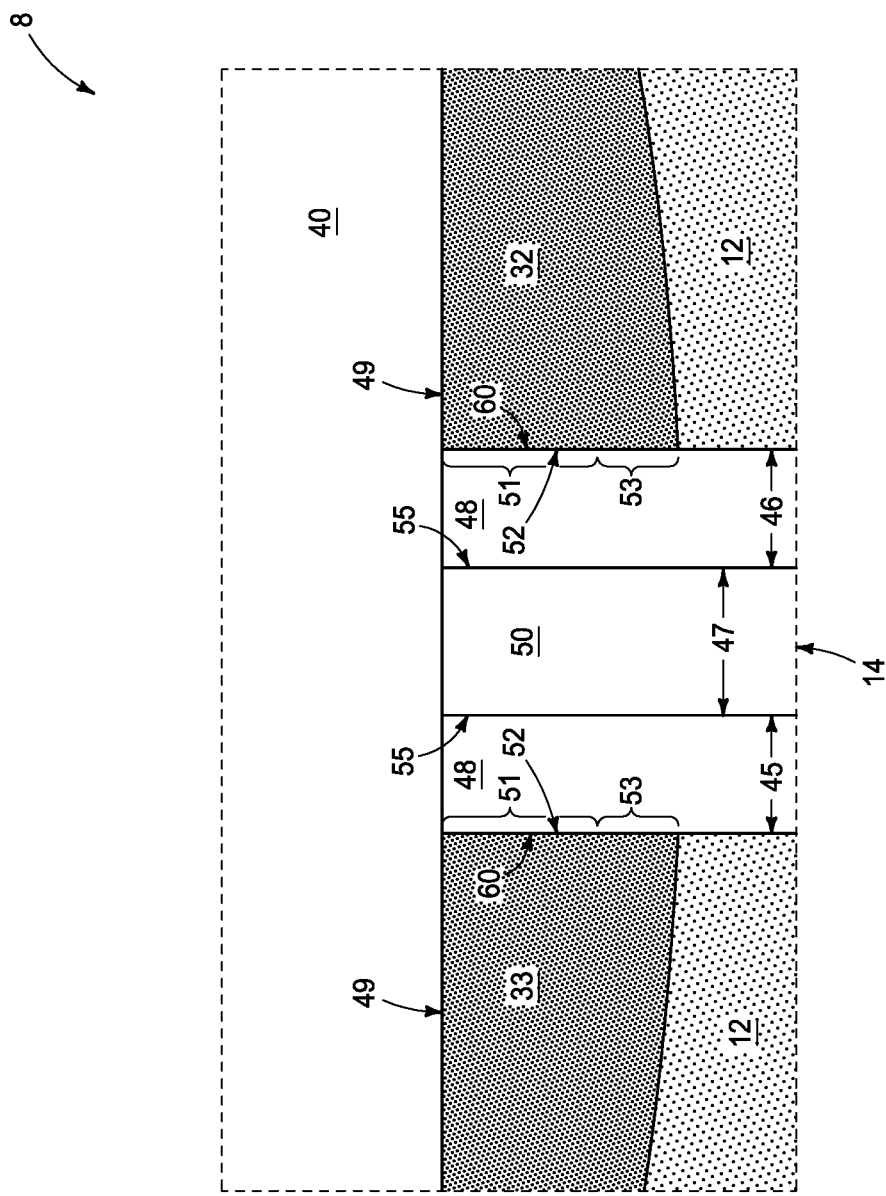
FIG. 3 is an enlarged view of a portion of FIG. 1.

Referring to FIGS. 1-3, an example fragment of a substrate construction 8 comprises an array or array area/region 10 and a peripheral circuitry area/region 13 that have been fabricated relative to a base substrate 11. Base substrate 11 may comprise any one or more of conductive/conductor/conducting (i.e., electrically herein), semiconductive/semiconductor/semiconducting, and insulative/insulator/insulating (i.e., electrically herein) materials. Various materials are above and within base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12, for example appropriately and variously doped monocrystalline and/or polycrystalline silicon, Ge, SiGe, GaAs, and/or other existing or future-developed semiconductive material. Trench isolation regions 14 and 15 in semiconductive material 12 define active area regions 16 comprising suitably and variously-doped semiconductive material 12. In but in one example embodiment, array area 10 will comprise memory cells occupying space within outlines 75, for example DRAM memory cells, individually comprising a field effect transistor device 25 and a charge-storage device such as a capacitor 85. However, embodiments of the invention encompass fabricating of other memory cells and other constructions of integrated circuitry independent of whether containing memory cells.

Example transistors 25 are in the form of recessed access devices (a type of construction of a field effect transistor), with example construction 8 showing such recessed access devices grouped in individual pairs of such devices. Individual recessed access devices 25 include a buried access line construction 18 within a trench in semiconductive material 12. Constructions 18 comprise conductive gate material (e.g., conductively-doped semiconductor material and/or metal material) that functions as a conductive gate of individual access devices 25. A gate insulator (e.g., silicon dioxide and/or silicon nitride, and not shown) is along sidewalls and a base of the individual trenches between the conductive gate material and semiconductive material 12. Insulator material 37 (e.g., silicon dioxide and/or silicon nitride) is within the trenches above the conductive gate material. Individual devices 25 comprise a pair of source/drain regions 24, 26 in upper portions of semiconductive material 12 on opposing sides of the individual trenches (e.g., regions 24, 26 being laterally outward of and higher than access line constructions 18). Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between the conductive gate material and is shared by the pair of devices 25. Others of the source/drain regions (e.g., regions 24) of the pair of source/drain regions are not shared by the pair of devices 25. Thus, in the example embodiment, each active area region 16 in array area 10 comprises two devices 25 (e.g., one pair of devices 25), with each sharing a central source/drain region 26.

A channel region (not numerically designated) is in semiconductive material 12 below pair of source/drain regions 24 and 26 along the trench sidewalls and around the trench base. The channel region may be suitably doped with a conductivity-increasing dopant likely of the opposite conductivity-type of the dopant in source/drain regions 24, 26. When suitable voltage is applied to the conductive gate material of an access line construction 18, a conductive channel forms within the channel region proximate the gate insulator such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

Digitlines 30 (only one being shown) have been formed and that individually directly electrically couple to the one shared source/drain region 26 of multiple (not shown) of the individual pairs of devices 25. Digitlines 30 comprise conductive material (e.g., metal material and/or conductively-doped semiconductive material). Elevationally-extending conductive vias 34 (e.g., metal material and/or conductively-doped semiconductive material, and only one via 34 being shown) extend downwardly from digitline 30. Conductive vias 34 individually directly electrically couple digitlines 30 to individual of shared source/drain regions 26 of the individual pairs of devices 25. A pair of capacitors 85 individually directly electrically couple to one of the other source/drain regions 24 in the individual pairs of devices 25.

Example peripheral circuitry area 13 comprises a pair of transistors 31 comprising a pair of source/drain regions 32, 33 having a channel region 35 there-between. A gate 36 comprising conductive material is operatively laterally between source/drain regions 32, 33. A gate insulator 38 separates gate 36 from channel region 35. Insulator material 40 (e.g., doped or undoped silicon dioxide and/or silicon nitride) is above the various depicted components in array area 10 and in peripheral circuitry area 13.

Source/drain regions 32, 33 are example diffusion regions 32, 33 to which an elevationally-elongated conductive via (not shown) will connect. In accordance with some embodiments of the invention, diffusion regions 32 and 33 need not be source/drain regions of a transistor, and may be any diffusion region. In this document, a "diffusion region" is defined as a region at least partially in semiconductive material and that has conductivity-enhancing dopant therein at a greater concentration than a region of the semiconductive material that is immediately-adjacent the diffusion region, and regardless of how the diffusion region was formed (e.g., regardless of whether formed by diffusion doping, ion implantation, or any other existing or future-developed technique).

Trench isolation regions 14, 15 in semiconductive material 12 may be of the same size, shape, and/or configuration relative one another (not shown) or may be of different at least one of size, shape, or configuration relative one another. Example trench isolation region 15 is of different size, shape, and configuration relative to that of a trench isolation regions 14. Regardless, and in some embodiments, a particular trench isolation region comprises laterally-opposing laterally-outermost first regions comprising a first material and comprises a second region laterally-inward of the first regions, with the second region comprising a second material of different composition from that of the first material. Example trench isolation region 15 is shown as comprising laterally-opposing laterally-outermost first regions 42, 43 comprising a first material 48 and comprising a second region 44 laterally-inward of first regions 42, 43. Second region 44 comprises a second material 50 that is of different composition from that of first material 48. Trench isolation region 14 comprises laterally-opposing laterally-outermost first regions 45, 46 and a second region 47 laterally-inward of first regions 45, 46. Second region 47 comprises second material 50 that is of different composition from that of first material 48. In one embodiment, the first regions of an individual trench isolation region are individually chemically homogenous, and in one such embodiment the second region is chemically homogenous everywhere laterally between the first regions (e.g., trench isolation region 14, not trench isolation region 15). In one embodiment, the second region is not chemically homogenous everywhere laterally between the first regions. For example, trench isolation region 15 is shown as comprising its second region 44 as comprising second material 50 and first material 48 laterally-inward thereof. In one embodiment, first material 48 is silicon dioxide and second material 50 is silicon nitride. In one embodiment, the first material and the first regions consist essentially of silicon dioxide and the second material and the second region consist essentially of silicon nitride. In one embodiment and as shown, the first regions are formed to individually be laterally thinner than the second region.

For purposes of the continuing discussion and in some embodiments, the first regions may be considered as having laterally-outer sidewalls 60 (FIG. 3) and second material 50/second region 47 may be considered as having a laterally-outer sidewall 55, in one embodiment a laterally-outermost sidewall 55. Further, diffusion region 32 and/or 33 may be considered as having a top surface 49 and a sidewall 52. Further, sidewall 52 may be considered as having some upper portion 51 and some lower portion 53. Diffusion region 32 and/or 33 is in an uppermost portion of semiconductive material 12 and directly against sidewall 52 of one of first regions 45, 46.

Figure 4:
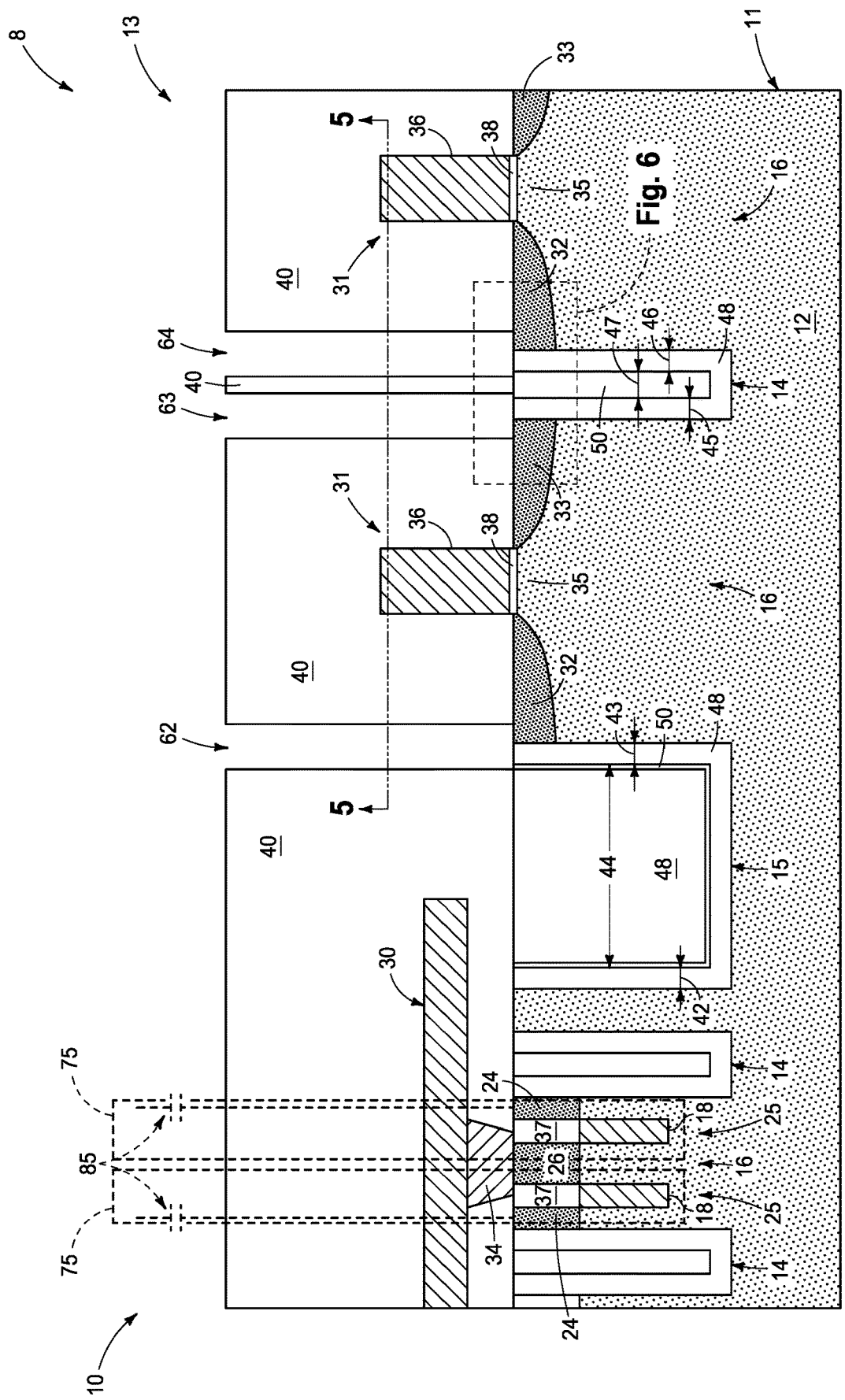
FIG. 4 is a view of the FIG. 1 construction at a processing step subsequent to that shown by FIG. 1.
Figure 5:
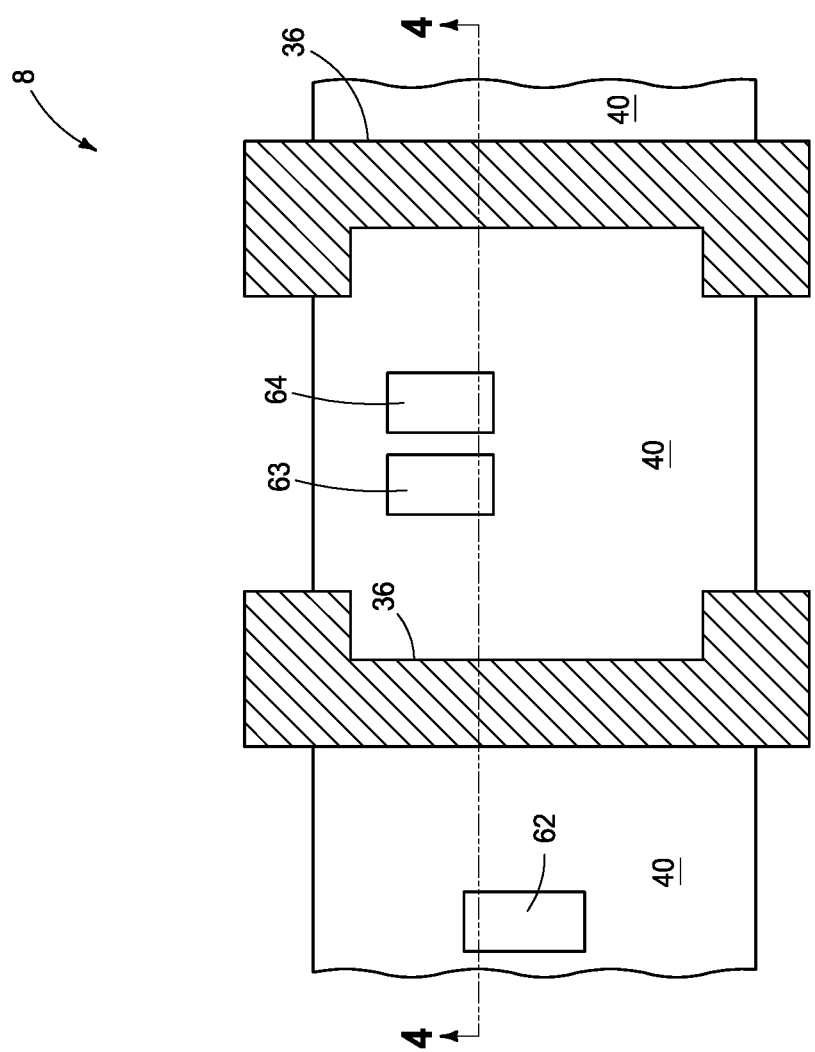
FIG. 5 is a view taken through line 5-5 in FIG. 4.
Figure 6:
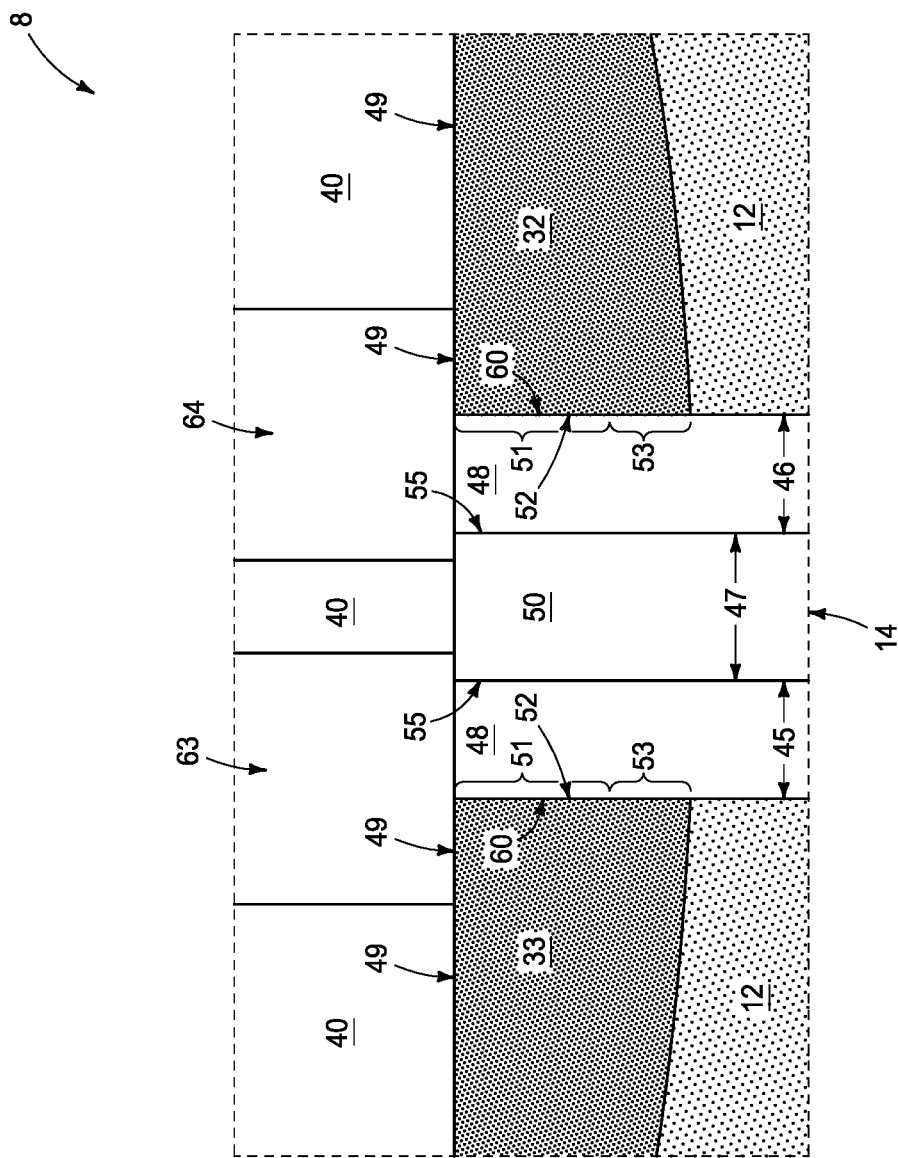
FIG. 6 is an enlarged view of a portion of FIG. 4.

Referring to FIGS. 4-6, a contact opening 62, 63, and/or 64 has been etched through insulator material 40 to a diffusion region 32 or 33 and to trench isolation region 15 or 14. The contact opening laterally overlaps the respective diffusion region and the associated one first region. In one embodiment, the contact opening laterally overlaps the respective second region 47 or 44. In one embodiment, such etching of the contact opening is stopped after etching into insulator material 40 and ideally after etching completely there-through to the diffusion region and the one first region. Such may, by way of example only, be conducted using photolithographic patterning (with or without pitch multiplication) and any suitable dry anisotropic etching chemistry, and in one embodiment the etching is conducted selectively relative to the diffusion region and the trench isolation region.

Figure 7:
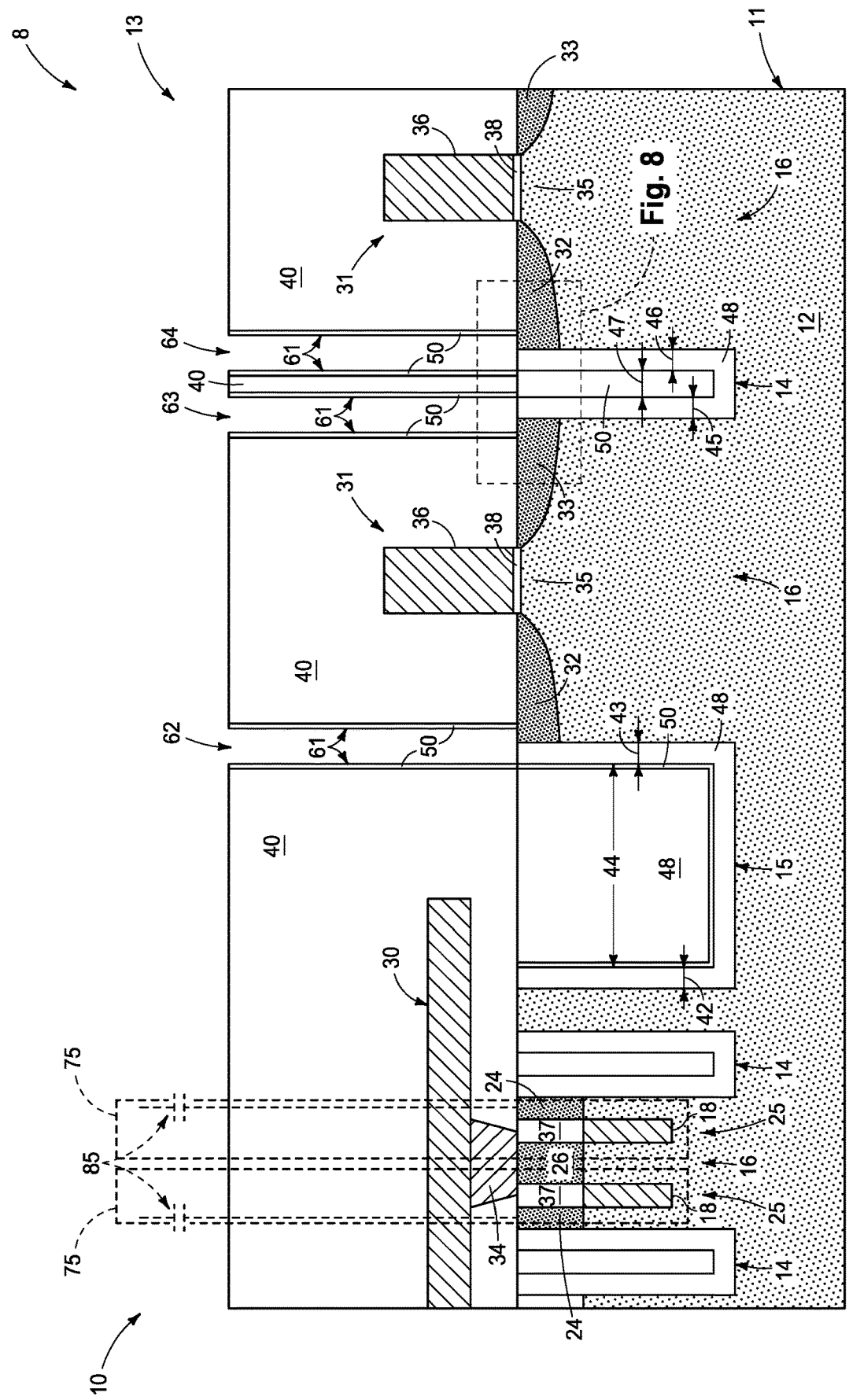
FIG. 7 is a view of the FIG. 4 construction at a processing step subsequent to that shown by FIG. 4.
Figure 8:
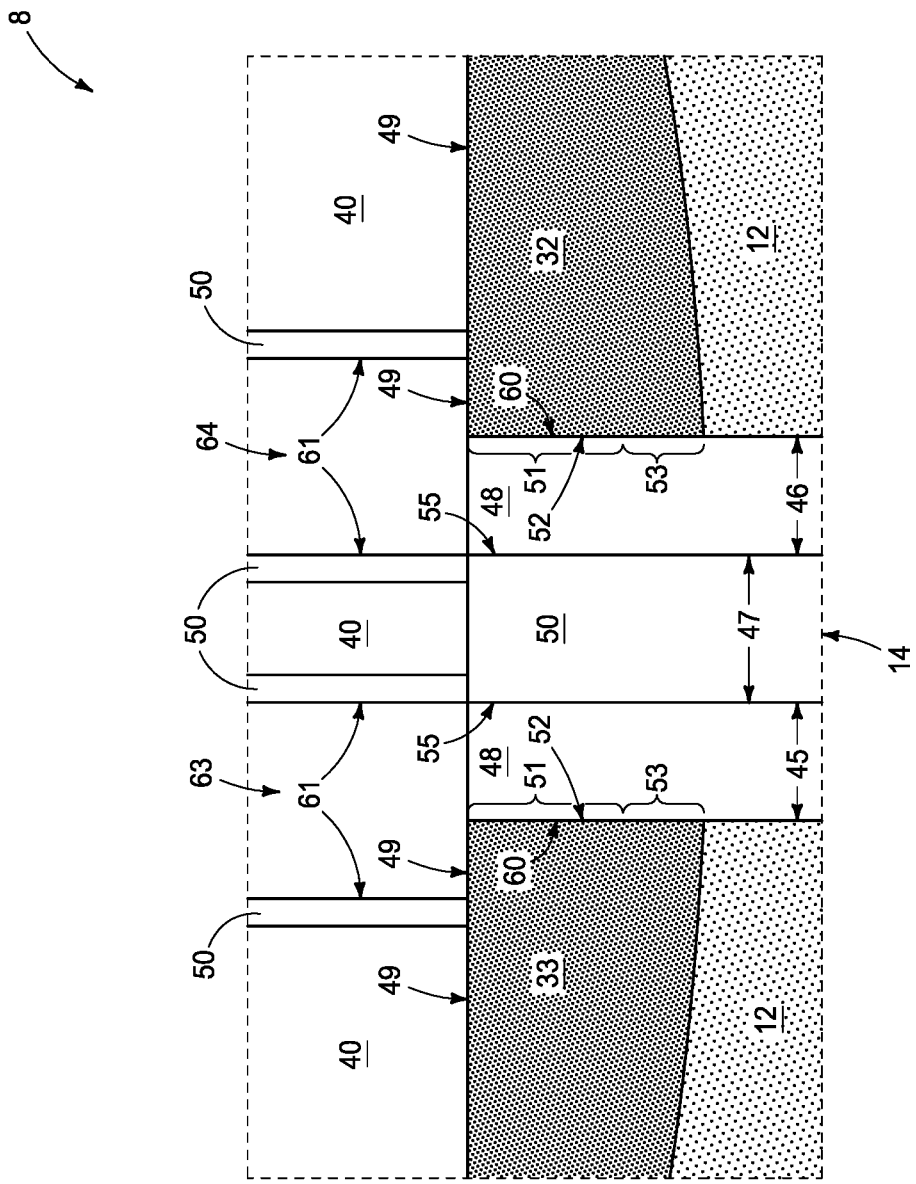
FIG. 8 is an enlarged view of a portion of FIG. 7.

Referring to FIGS. 7 and 8, and in one embodiment, a dielectric lining 61 (e.g., a material of different composition from that of insulator material 40, and in one embodiment which comprises second material 50) has been formed along sidewalls of contact opening 62, 63, and/or 64. Dielectric lining 61 may be formed by depositing a conformal layer of material 50 followed by maskless anisotropic etch thereof to substantially remove such from being over horizontal surfaces. In one embodiment where the contact opening laterally overlaps a second region 44 or 47, dielectric lining 61 laterally overlaps second region 44 or 47.

Figure 9:
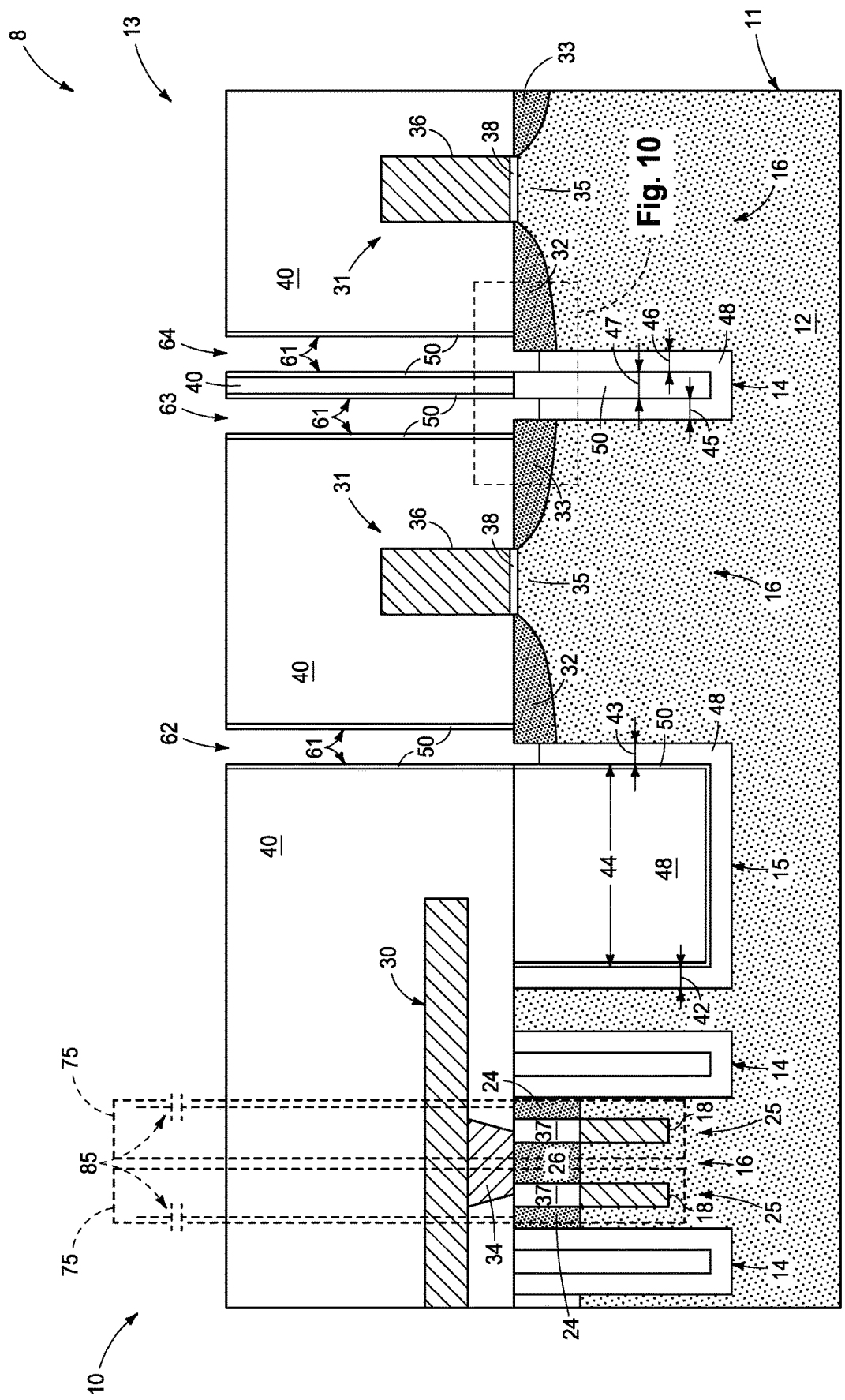
FIG. 9 is a view of the FIG. 7 construction at a processing step subsequent to that shown by FIG. 7.
Figure 10:
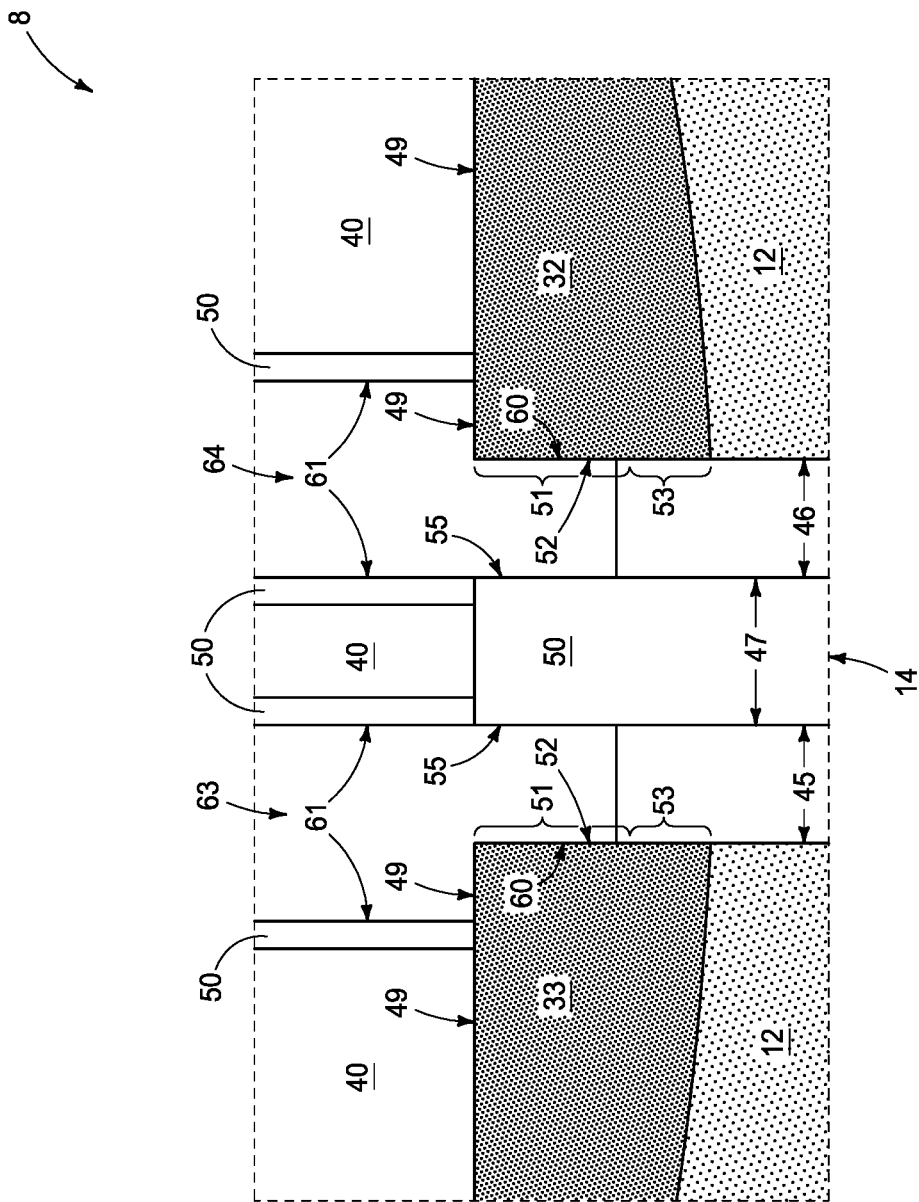
FIG. 10 is an enlarged view of a portion of FIG. 9.

Referring to FIGS. 9 and 10, the etching of contact opening 62, 63 and/or 64 has been continued into first material 48 of the respective one first region 45, 46 or 43 selectively relative to second material 50 of the respective isolation region 14 or 15 and selectively relative to diffusion region 32 and/or 33. In one embodiment, such etching is also conducted selectively relative to dielectric lining 61 when present. Insulator material 40 and first material 48 may be of the same or different composition(s) relative one another. If of the same composition, the etching through insulator material 40 may be conducted as a timed etch to preclude significant etching into first material 48 prior to forming dielectric lining 61 when such is so formed. The artisan may select any suitable existing or future-developed etching chemistry for such etching.

Figure 11:
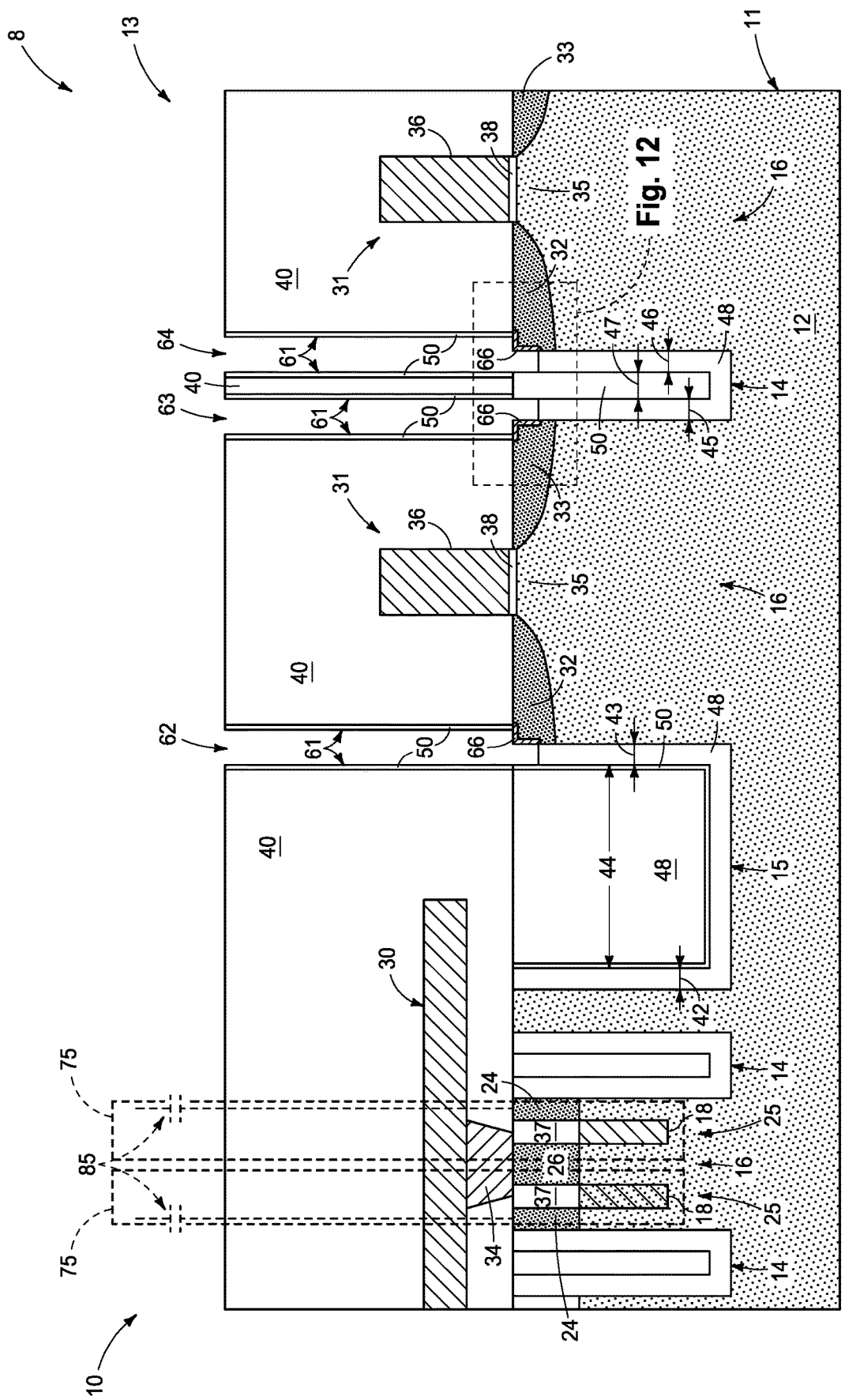
FIG. 11 is a view of the FIG. 9 construction at a processing step subsequent to that shown by FIG. 9.
Figure 12:
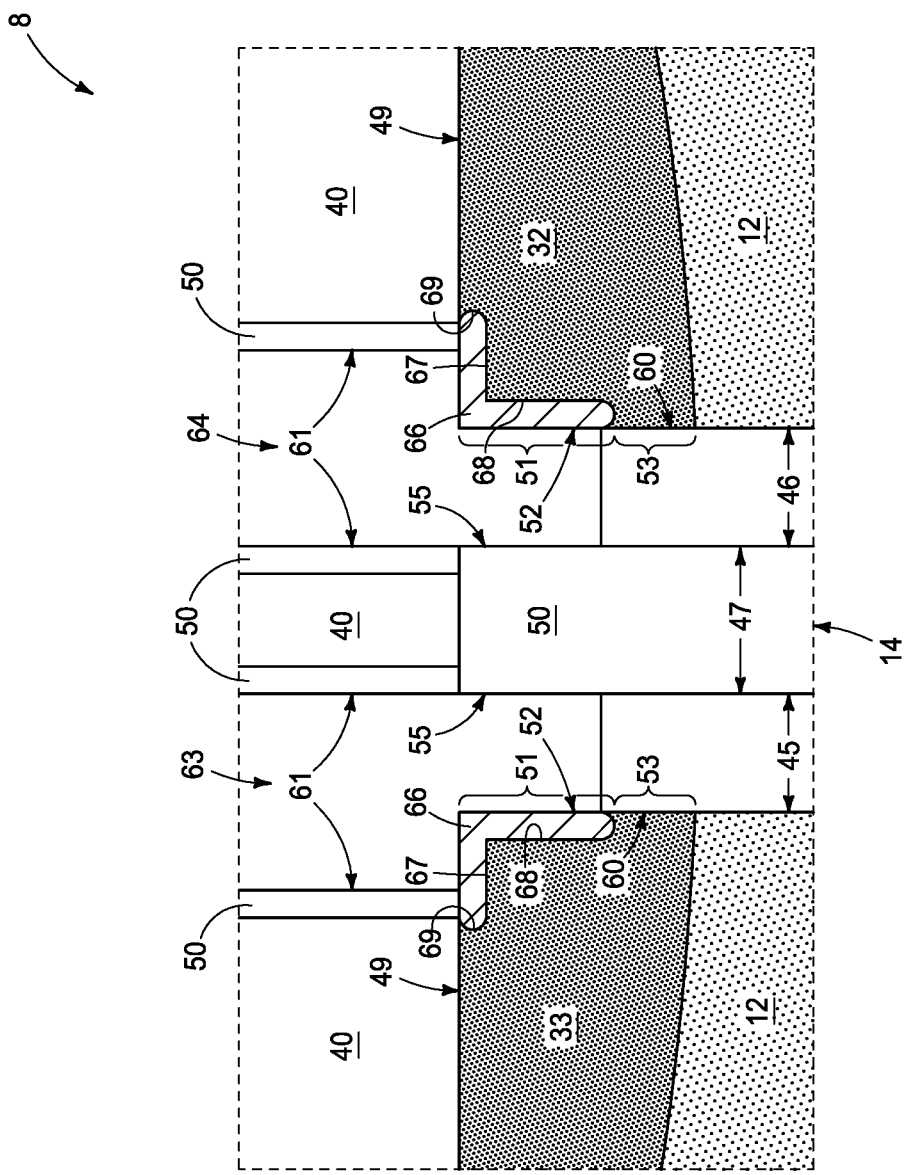
FIG. 12 is an enlarged view of a portion of FIG. 11.

Conductive material is ultimately forming in contact opening 62, 63 and/or 64 directly against a top surface and a sidewall of the diffusion region. In one embodiment and as shown in FIGS. 11 and 12, the conductive material comprises a conductive metal silicide 66. Such may be formed by any existing or future-developed technique, for example by reaction of a refractory metal (not shown) with silicon of diffusion region 32 or 33 (when such comprises silicon), followed by etching away the refractory metal selectively relative to the formed silicide. In such example and as shown in FIG. 12, such has formed diffusion region 32, 33 to have another top surface 67 and other sidewalls 68 and 69, with conductive metal silicide 66 being directly there-against. Conductive metal silicide 66 is vertically thicker along sidewall 68 of the diffusion region than above top surface 67.

Figure 13:
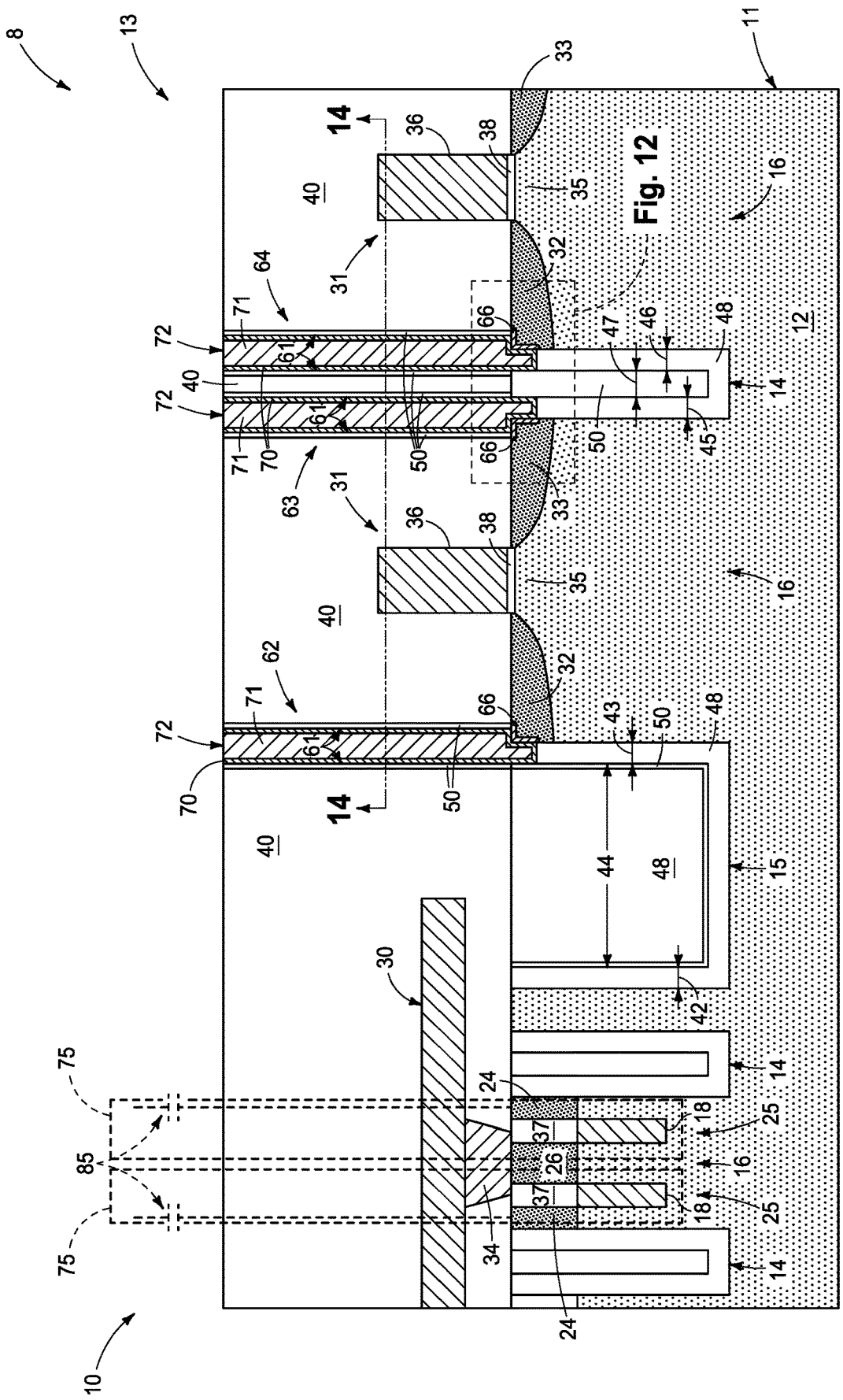
FIG. 13 is a view of the FIG. 11 construction at a processing step subsequent to that shown by FIG. 11.
Figure 14:
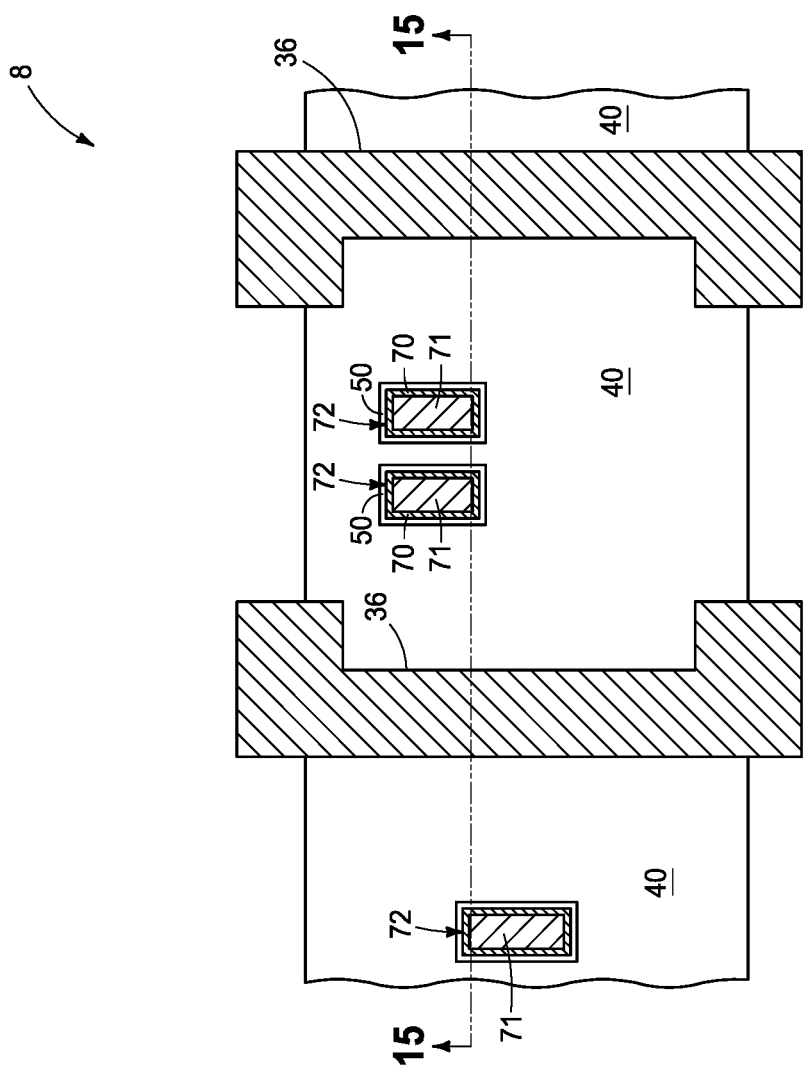
FIG. 14 is a view taken through line 14-14 in FIG. 13.
Figure 15:
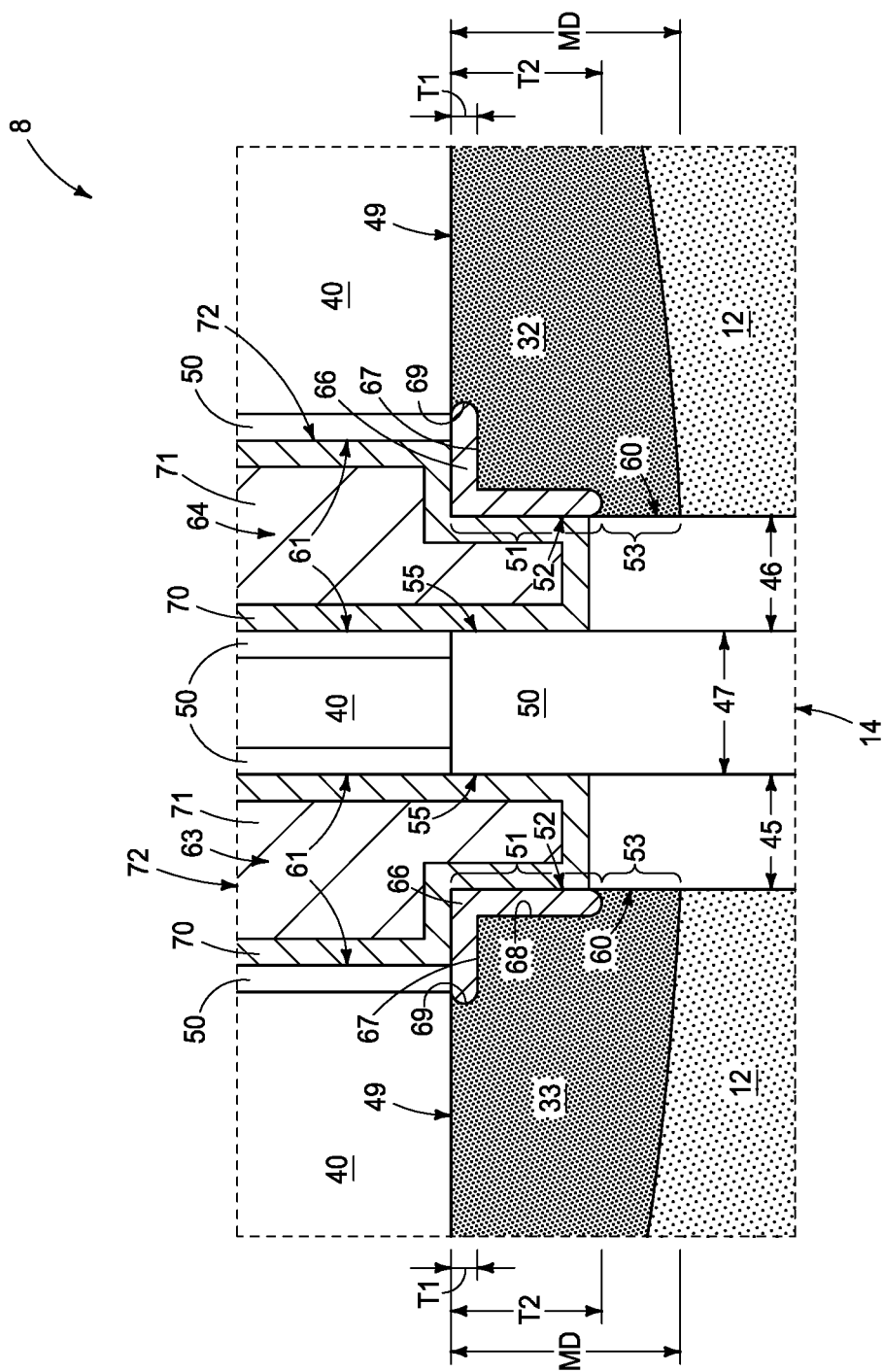
FIG. 15 is an enlarged view of a portion of FIG. 13.

Referring to FIGS. 13-15, additional conductive material 70 (e.g., titanium nitride) and conductive material 71 (e.g., elemental tungsten) have been formed within contact openings 62, 63 and 64. Accordingly and in one embodiment, conductive material (e.g., a combination of conductive materials 66, 70, and 71) has been formed in the respective contact opening directly against a top surface (e.g., 67) and a sidewall (e.g., 68) of the respective diffusion region. In one embodiment and as shown, the conductive material extends no deeper into the respective diffusion region than two thirds of a maximum depth MD (FIG. 15) of the diffusion region in semiconductive material 12. Such may reduce current leakage to substrate material 12 below that which would otherwise occur if the conductive material extends more than two thirds of such maximum depth and/or may reduce risk of the conductive material extending completely through the source/drain region to substrate material 12 there-below.

Any other attribute(s) or aspect(s) as shown and/or described herein with respect to other embodiments may be used with respect to the above described embodiments.

Figure 16:
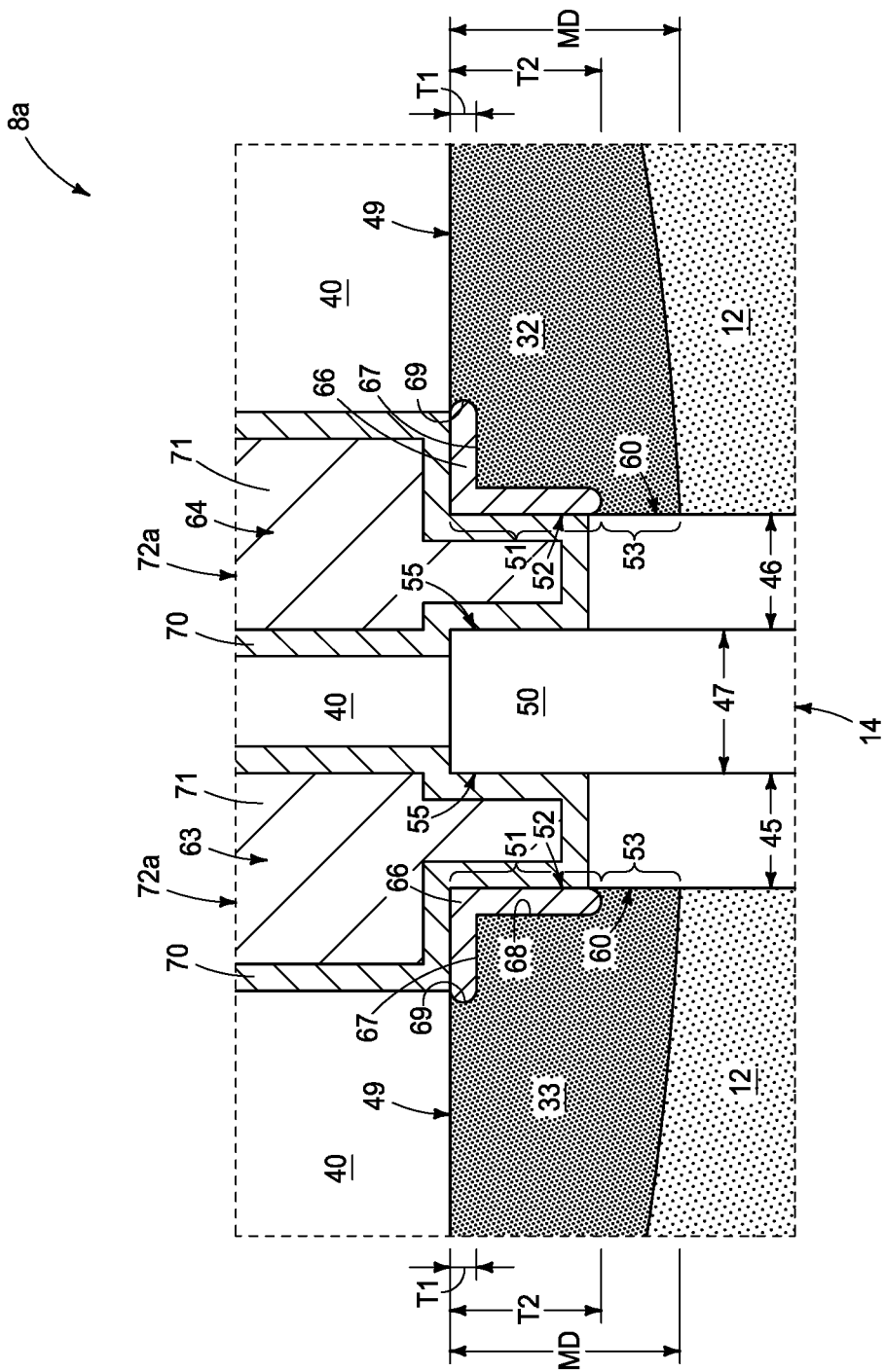
FIG. 16 is a diagrammatic cross-sectional view of a portion of a construction in accordance with an embodiment of the invention.

In one embodiment, conductive material 66/70/71 does not laterally overlap second region 47 and/or 44, for example as shown. Alternately, the conductive material does laterally overlap the second region, for example as shown with respect to an alternate embodiment construction 8a with conductive vias 72a in FIG. 16. Like numerals from the above-described embodiments have been used where appropriate, with some construction difference being indicated with the suffix "a". FIG. 16 also shows an example embodiment devoid of a dielectric lining 61 (not shown). Any other attribute(s) or aspect(s) as shown and/or described herein with respect to other embodiments may be used.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structures and/or devices embodiments.

In some embodiments, a construction (e.g., 10, 10a) of integrated circuitry (e.g., existing or future-developed circuitry, for example logic and/or memory) comprises a trench isolation region (e.g., 14 or 15) in semiconductive material (e.g., 12). The trench isolation region comprises laterally-opposing laterally-outermost first regions (e.g., 45, 46 or 42, 43) comprising a first material (e.g., 48) and comprising a second region (e.g., 47 or 44) laterally-inward of the first regions. The second region comprises a second material (e.g., 50) of different composition from of that of the first material. A diffusion region (e.g., 32 or 33) is in an uppermost portion of the semiconductive material directly against a sidewall (e.g., 60) of one of the first regions. Insulator material (e.g., 40) is above the trench isolation region and the diffusion region. An elevationally-elongated conductive via (e.g., 72 or 72a) is in the insulator material and extends to the diffusion region and the trench isolation region. The conductive via laterally overlaps the diffusion region and the one first region. The conductive via is directly against a top surface (e.g., 67) of the diffusion region, is directly against an upper portion (e.g., 51) of a sidewall (e.g., 68) of the diffusion region. The conductive via is directly against a laterally-outer sidewall (e.g., 55) of the second material of the second region of the trench isolation material. Any other attribute(s) or aspect(s) as shown and/or described herein with respect to other embodiments may be used.

An embodiment of the invention comprises a construction (e.g., 10, 10a) of integrated circuitry comprising a trench isolation region (e.g., 14 or 15) in semiconductive material (e.g., 12) and in some embodiments regardless of whether comprising the above-described first region, second region, first material, and/or second material. A diffusion region (e.g., 32 or 33) is in an uppermost portion of the semiconductive material and is directly against a sidewall (e.g., 60) of the trench isolation region. Insulator material (e.g., 40) is above the trench isolation region and the diffusion region. An elevationally-elongated conductive via (e.g., 72 or 72a) is in the insulator material and extends to the diffusion region and the trench isolation region. The conductive via laterally overlaps the diffusion region and the trench isolation region. The conductive via is directly against a top surface (e.g., 67) of the diffusion region and is directly against a sidewall (e.g., 68) of the diffusion region. The conductive via comprises a conductive metal silicide (e.g., 66) directly against the top surface and the sidewall of the diffusion region. The conductive metal silicide is vertically thicker (e.g., T2 in FIG. 15) along the sidewall of the diffusion region than it is (e.g., T1 in FIG. 15) above the top surface. Any other attribute(s) or aspect(s) as shown and/or described herein with respect to other embodiments may be used.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming an elevationally-elongated conductive via to a diffusion region in semiconductive material comprises forming a trench isolation region in semiconductive material. The trench isolation region comprises laterally-opposing laterally-outermost first regions that comprise a first material and a second region laterally-inward of the first regions. The second region comprises a second material of different composition from that of the first material. A diffusion region is formed in an uppermost portion of the semiconductive material directly against a sidewall of one of the first regions. Insulator material is formed above the trench isolation region and the diffusion region. A contact opening is etched through the insulator material to the diffusion region and the trench isolation region. The contact opening laterally overlaps the diffusion region and the one first region. The contact opening is etched into the first material of the one first region selectively relative to the second material of the isolation region and selectively relative to the diffusion region. Conductive material is formed in the contact opening directly against a top surface and a sidewall of the diffusion region.

In some embodiments, a construction of integrated circuitry comprises a trench isolation region in semiconductive material. The trench isolation region comprises laterally-opposing laterally-outermost first regions which comprise a first material and a second region laterally-inward of the first regions. The second region comprises a second material of different composition from that of the first material. A diffusion region is in the uppermost portion of the semiconductive material directly against a sidewall of one of the first regions. Insulator material is above the trench isolation region and the diffusion region. An elevationally-elongated conductive via is in the insulator material and extends to the diffusion region and the trench isolation region. The conductive via laterally overlaps the diffusion region and the one first region. The conductive via is directly against a top surface of the diffusion region, is directly against an upper portion of a sidewall of the diffusion region, and is directly against a laterally-outer sidewall of the second material of the second region of the trench isolation material.

In some embodiments, a construction of integrated circuitry comprises a trench isolation region in semiconductive material. A diffusion region is in the uppermost portion of the semiconductive material directly against a sidewall of the trench isolation region. Insulator material is above the trench isolation region and the diffusion region. An elevationally-elongated conductive via is in the insulator material and extends to the diffusion region and the trench isolation region. The conductive via laterally overlaps the diffusion region and the trench isolation region. The conductive via is directly against a top surface of the diffusion region and is directly against a sidewall of the diffusion region. The conductive via comprises a conductive metal silicide directly against the top surface and the sidewall of diffusion region. The conductive metal silicide is vertically thicker along the sidewall of the diffusion region than above the top surface.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A construction of integrated circuitry comprising:
   a trench isolation region in semiconductive material, the trench isolation region comprising laterally-opposing laterally-outermost first regions comprising a first material and comprising a second region laterally-inward of the first regions, the second region comprising a second material of different composition from that of the first material;
a diffusion region in an uppermost portion of the semiconductive material directly against a sidewall of one of the first regions;
insulator material above the trench isolation region and the diffusion region; and
an elevationally-elongated conductive via in the insulator material extending to the diffusion region and the trench isolation region, the conductive via laterally overlapping the diffusion region and the one first region; the conductive via being directly against a top surface of the diffusion region, being directly against an upper portion of a sidewall of the diffusion region, and being directly against a laterally-outer sidewall of the second material of the second region of the trench isolation material.

2. The construction of claim 1 wherein the first material and the second material are insulative.

3. The construction of claim 1 wherein,
the first regions are individually chemically homogenous; and
the second region is chemically homogenous everywhere laterally between the first regions.

4. The construction of claim 3 wherein the first material and the first regions consist essentially of silicon dioxide and the second material and the second region consist essentially of silicon nitride.

5. The construction of claim 1 wherein the first material is silicon dioxide and the second material is silicon nitride.

6. The construction of claim 1 wherein the second region is not chemically homogenous everywhere laterally between the first regions.

7. The construction of claim 6 wherein the first regions are individually chemically homogenous.

8. The construction of claim 1 wherein the conductive via laterally overlaps the second region.

9. The construction of claim 1 wherein the conductive via does not laterally overlap the second region.

10. The construction of claim 1 wherein the conductive via extends into the diffusion region and to no deeper than two thirds of a maximum depth of the diffusion region in the semiconductive material.

11. The construction of claim 1 wherein the first regions are individually laterally thinner than the second region.

12. The construction of claim 1 further comprising a dielectric lining along sidewalls of the conductive via.

13. The construction of claim 12 wherein the dielectric lining comprises the second material.

14. The construction of claim 12 wherein the conductive via laterally overlaps the second region, the dielectric lining laterally overlapping the second region.

15. The construction of claim 1 wherein the conductive via comprises a conductive metal silicide that is directly against the top surface and the sidewall of the diffusion region, the conductive metal silicide being vertically thicker along the sidewall of the diffusion region than above the top surface.

16. A construction of integrated circuitry comprising:
a trench isolation region in semiconductive material;
a diffusion region in an uppermost portion of the semiconductive material directly against a sidewall of the trench isolation region;
insulator material above the trench isolation region and the diffusion region; and
an elevationally-elongated conductive via in the insulator material extending to the diffusion region and the trench isolation region, the conductive via laterally overlapping the diffusion region and the trench isolation region, the conductive via being directly against a top surface of the diffusion region and being directly against a sidewall of the diffusion region, the conductive via comprising a conductive metal silicide directly against the top surface and the sidewall of diffusion region, the conductive metal silicide being vertically thicker along the sidewall of the diffusion region than above the top surface.

17. The construction of claim 16 wherein the conductive via extends into the diffusion region and to no deeper than two thirds of a maximum depth of the diffusion region in the semiconductive material.

18. The construction of claim 16 further comprising a dielectric lining along sidewalls of the conductive via.

19. The construction of claim 18 wherein the conductive via extends into the diffusion region and to no deeper than two thirds of a maximum depth of the diffusion region in the semiconductive material.

* * * * *